United States Patent [19]
Rhodes

[11] Patent Number: 4,868,527
[45] Date of Patent: Sep. 19, 1989

[54] FREQUENCY SET-ON OSCILLATOR

[76] Inventor: John D. Rhodes, Boodles, Thorpe Lane, Guiseley Leeds, England, LS20 8JH

[21] Appl. No.: 167,367

[22] Filed: Mar. 14, 1988

[30] Foreign Application Priority Data

Mar. 24, 1987 [GB] United Kingdom ............... 8706962

[51] Int. Cl.⁴ .............................................. H03B 5/00
[52] U.S. Cl. ..................................... 331/173; 331/166
[58] Field of Search ............... 331/165, 166, 172, 173, 331/174, 187; 330/51

[56] References Cited

U.S. PATENT DOCUMENTS 3,355,677 11/1967 Egan ....................................... 331/173
4,577,161 3/1986 Hirohashi et al. ................. 330/51 X

FOREIGN PATENT DOCUMENTS 1964287 6/1971 Fed. Rep. of Germany ...... 331/174

Primary Examiner—Eugene R. Laroche
Assistant Examiner—Robert J. Pascal

[57] ABSTRACT

A frequency set-on oscillator comprises an input switch (12) an amplifier (22) and a delay line (16). A frequency divider (14) having two outputs is provided in line with the input switch (12). The two outputs of the frequency divider are connected to a mixer (20), one of the outputs containing the delay line (16). The output of the mixer (22) is fed to the amplifier (22) and the output of the amplifier is fed back to the input switch (12) via a bandpass filter (24). The device of the invention is a very simple network configuration capable of sustaining a desired frequency for very much longer periods than has been possible with previous devices.

9 Claims, 3 Drawing Sheets

FREQUENCY SET-ON OSCILLATOR

This invention relates to oscillators, in particular to frequency set-on oscillators. A frequency set-on oscillator is an electronic device which is capable of oscillating at many modal frequencies and is triggered into any one such mode by a sample of an input frequency. In general the frequency set-on oscillator then locks into a mode of oscillation at a frequency adjacent to the freqency of the input frequency.

A recirculating amplifier system has been used in a similar manner but is normally unable to sustain oscillations for longer than a few microseconds. Such a system is shown in FIG. 1 of the accompanying drawings. In this system a switch allows the input frequency to enter an amplifier and fill a delay line with the signal. The switch is then closed and the signal recirculates in the amplifier-delay line loop. The signal is limited in amplitude by the saturation of the amplifier which will then convert the signal into a general frequency modulated signal. The energy content of the spectrum of this signal will be concentrated at the natural modes of the system. If the delay around the loop is $\tau$ seconds, then these modes occur at frequencies separated by $1/\tau$ Hz.

If initially the majority of the energy is at a modal angular frequency $\omega_m$ ($2\pi f_m$) then the instantaneous frequency of the signal emerging from the amplifier may be expressed as:

$$\omega_M + \sum_i a_i \left[ \sin\left( \frac{2\pi i t}{\tau} + \psi_i \right) \right] \quad (1)$$

wherein t is time, $\Psi_i$ is a phase component, $a_i$ is an amplitude coefficient and i an integer.

If there is any gain variation in the loop, then the amplitude of the sidebands will change relative to one another prior to entering the last stage of the amplifier where saturation occurs. Saturation causes an amplitude to phase modulation conversion and the coefficients $a_i$ of the instantaneous frequency given in equation (1) will only decrease if:

$$G'' < 0 \text{ (evaluated at all modes)} \quad (2)$$

where G is the gain as a function of frequency and $G''$ is the second differential of G with respect to frequency.

To maintain this condition over a reasonable bandwidth is impossible whilst ensuring the absolute gain requirements to sustain oscillation. Thus, any noise present in the system will increase energy at modes of operation away from the input frequency in every cycle and thus the system degenerates into producing random levels of energy at the modal frequencies. For reasonable bandwidths this normally occurs within ten to a hundred cycles.

A further complication occurs owing to the fact that, when the switch closes, a phase discontinuity is produced in the signal, if the input frequency does not coincide exactly with one of the modal frequencies, which then continues to circulate around the loop. This causes energy to be initially shared between modes and does not allow energy to be concentrated at one mode unless the input signal corresponds to a mode of the system.

Many attempts have been made to increase the time duration of the signal in the loop. Narrowband filters have been switched into the loop to enable condition (2) above to be more readily achieved and adaptive phase correction circuits introduced into the loop to adjust a mode of the system to a frequency corresponding to the input frequency. However, all of these techniques have only marginally improved the performance of the system.

The invention seeks to provide a frequency set-on oscillator improved in the above respects.

According to the present invention there is provided a frequency set-on oscillator which comprises an input switch, an amplifier and a delay line characterized in that a frequency divider having two outputs is provided in line with the input switch, the two outputs of the frequency divider are connected to a mixer, one of the outputs contains a delay line, the output of the mixer is fed to the amplifier and the output of the amplifier is fed back to the input switch via a bandpass filter.

In the device of the invention the switch is again connected to the input frequency. The signal is then fed to a frequency divider to divide the frequency, preferably by a factor of 2. This divider may be a digital or analogue divider, although the former is generally preferred. In both cases a finite input signal is required to trigger a finite output. Two outputs are connected, one by a delay line, to a mixer. The other output is preferably connected via an amplifier to the mixer in order to maintain signal level. The mixer may be replaced by a digital Exclusive OR gate. The output of the mixer is fed to an amplifier and then to a bandpass filter which is selected to reflect all signals other than the upper side band. This, in effect, restores the divided frequency to its original value. However, as will be more fully explained hereinafter, the circuitry of the device of the invention inhibits the generation of other frequencies or 'noise' and thus allows the recirculating frequency to be maintained indefinitely.

It will be appreciated that the delay line employed in the device of the invention may be an actual or simulated delay line, i.e. the delay line can be replaced by a filter having the same effect.

The invention will be described further, by way of example, with reference to the accompanying drawings, in which.

Figure 1:
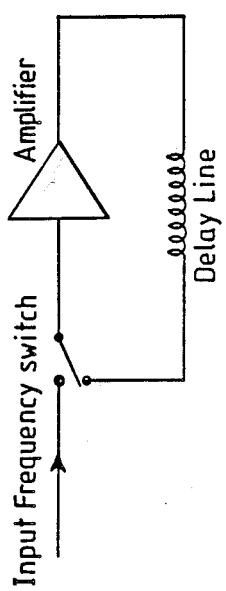
FIG. 1 is a diagrammatic representation of a known form of a recirculating amplifier.
Figure 2:
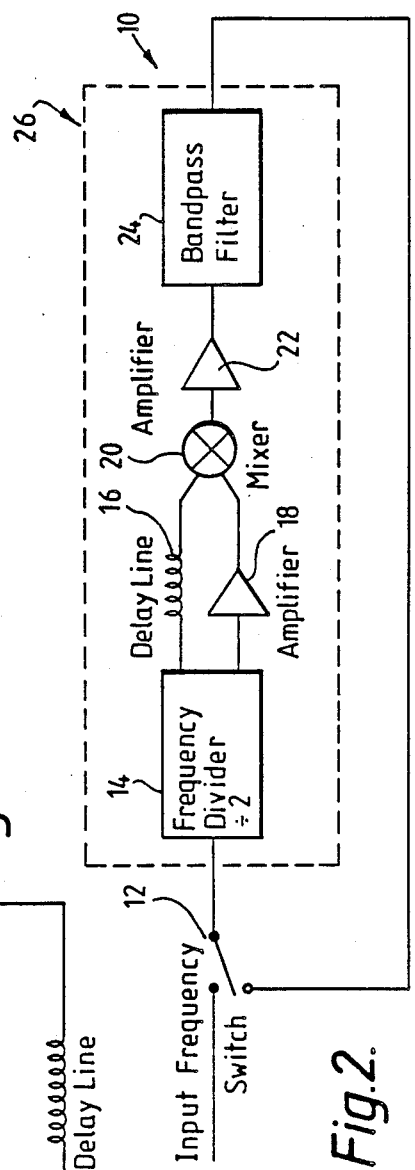
FIG. 2 is a diagrammatic representation of a device in accordance with the invention.
Figure 3:
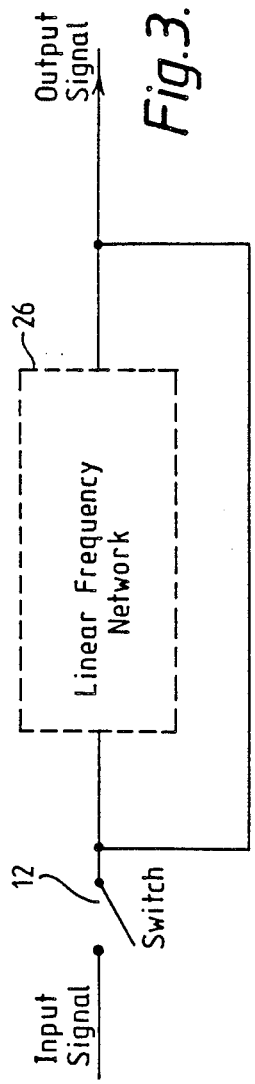
FIG. 3 is a similar diagram to FIG. 2 in a simplified form.
Figure 4:
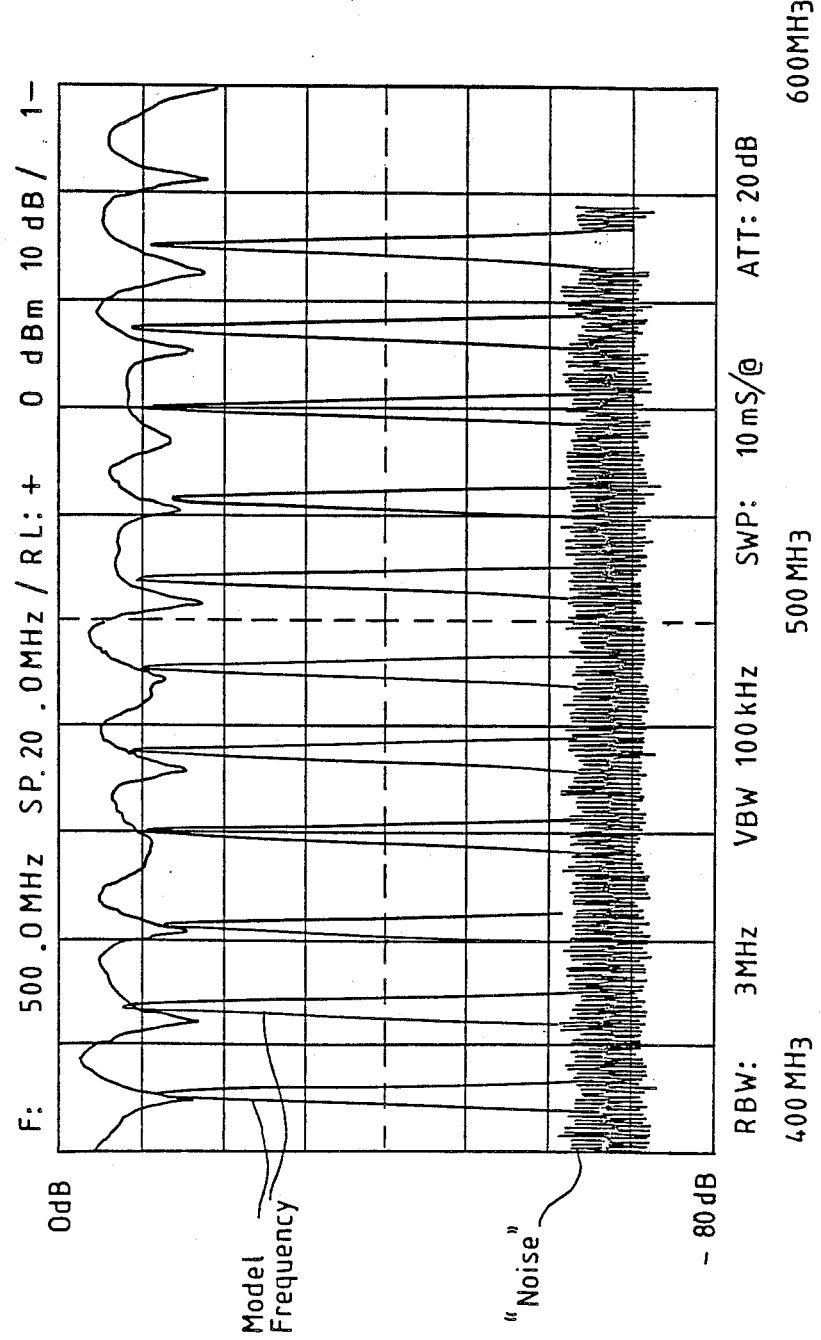
FIG. 4 is a graphical representation of frequency against attenuation of a device in accordance with the invention.

Referring to the drawings, and in particular FIGS. 2 to 4, an oscillator 10 in accordance with the invention comprises a input frequency switch 12 connected to a frequency divider 14, preferably of digital operation and capable of dividing the input signal by two. Two outputs from the freqency divider are provided and a delay line, or electronic equivalent thereof, 16 is located in one of the outputs and an amplifier 18 located in the other of the outputs. The outputs are then connected to a mixer 20 and from there to a further amplifier 22. A bandpass filter 24 is connected into the output from the amplifier 22 and is set to reflect all signals other than the upper side band, that is all signals below the sum of the output frequencies of the frequency divider. The bandpass filter is selected to have relatively broad band characteristics so that it will pass all frequencies of interest in the desired range, for example between 400 and 600 MHz. Passing the upper sideband effectively reconstitutes the frequency of the input signal into the frequency divider 14. The entire network may be termed a 'linear frequency network'.

If the delay in the delay line is $\tau$ secs and the delay through the filter is $\tau_1$ secs, then if $w_I(t)$ and $w_o(t)$ are the input and output instantaneous angular frequencies of the signal then $$\omega_o(t) = \frac{1}{2}\left[\omega_1(t - \tau_1) + \omega_1\left(t - \tau_1 - \frac{\tau}{2}\right)\right] \quad (3)$$

Since no output occurs from the mixer until two signals are present at the inputs, any output is delayed $\tau$ secs. However, since the loop has to be filled with energy before closing the switch and the total effective delay is $$\tau_1 + \frac{\tau}{2}$$

secs, this condition is not a restriction.

The modal separation will be $1/(\tau_1+\tau/2)$ Hz, and due to the limiting action of the frequency divider an effective frequency modulated signal will appear in the loop after the switch has closed, as described in equation (1). Substituting this into equation (3), it may be shown that all of the sidebands decrease in amplitude if:

$$(2m-r)\neq 2r \quad (4)$$

wherein m and r are integers smaller than the number of modes in the band of operation. Thus, a single dominant mode is sustained and energy in all other modes initially excited by noise will not be allowed to increase in amplitude. However, gain variations in the loop must also be considered as before. This may be investigated by modifying the network as shown in FIG. 3, i.e. by taking an output signal from the linear frequency network.

With the switch 12 closed the level of the input signal is sufficient to prevent free oscillating and the output signal level may be measured with respect to frequency. To form the frequency set-on oscillator, the switch is then opened. In this configuration the overall condition for stable modes of oscillation is given in equation (2) above.

An experimental device covering the freqency band 400 to 600 MHz was built and the gain variations as a function of frequency plotted. This is shown in FIG. 4 together with the frequencies at which the system oscillates. For this device $\tau = 100$ nS and $\tau_1 = 8$ nS giving a mode separation of approximately 17 MHz.

When the switch 12 closes, a phase discontinuity occurs. However, due to equation (3), more phase discontinuities of lower magnitude are rapidly produced causing the input instruction frequency to rapidly change in the loop on to an adjacent mode frequency. The speed is primarily due to the smaller delay $\tau_1$. Results on the experimental device showed that at any frequency in the band, upon opening the switch, the oscillator always jumped into a stable frequency of oscillation at an adjacent mode.

Thus it can be seen that the device of the invention provides a true frequency set-on oscillator in which a frequency at or very near to a given input frequency can be sustained indefinitely. The mixers used in the invention may be any form of mixer but will normally require a bandpass filter to extract the correct sideband.

The device of the invention is a very simple network configuration and is capable of sustaining the desired frequency for very much longer periods than has been possible with prior art devices.

Figure 5:
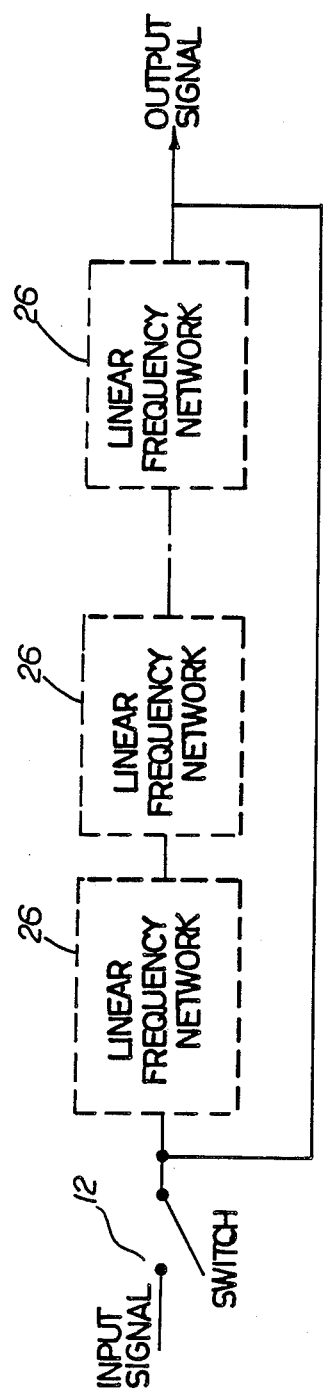
FIG. 5 is a diagram of a device in accordance with an alternative embodiment of the invention.

Referring to FIG. 5, more complex devices may be constructed using a cascade 30 of these sections 26 where the delay $\tau$ varies between each section. When used as frequency set-on oscillators, such devices can exhibit faster locking times.

I claim:

1. A frequency set-on oscillator of the kind in which an input switch selectively couples an input signal to an amplifier and a delay line, said oscillator comprising a frequency divider having an input serially coupled to the input switch, the frequency divider having a first output coupled to a mixer and a second output coupled to the mixer through said delay line, the output of the mixer being coupled to said amplifier and the output of said amplifier being coupled to the input switch via a bandpass filter.

2. An oscillator as claimed in claim 1 in which the frequency divider divides the frequency by a factor of 2.

3. An oscillator as claimed in either of claims 1 or 2 in which the frequency divider is a digital divider.

4. An oscillator as claimed in claim 1 in which the first output of the frequency divider is coupled via a second amplifier to the mixer.

5. An oscillator as claimed in claim 1 in which the mixer comprises a digital Exclusive OR gate.

6. An oscillator as claimed in claim 1 wherein the mixer produces an output including an upper side band and a lower side band, the bandpass filter being selected to reflect all signals other than the upper side band.

7. An oscillator as claimed in claim 1 in which the delay line is an actual delay line or a simulated delay line.

8. An oscillator as claimed in claim 7 in which the delay line includes a simulated delay line comprising a filter.

9. An oscillator as claimed in claim 8 further comprising
a plurality of oscillator sections, each one of said oscillator sections including: a frequency divider having an input that provides the input o said section and having a first output coupled to a mixer and a second output coupled to said mixer through a delay line; an amplifier fed by an output of said mixer; and a bandpass filter coupled to an output of said amplifier, said bandpass filter having an output that serves as the output of said section,
said plurality of sections being serially cascaded between said input switch and an output port, said input switch being coupled to the input of the first section in the cascade, and the output of the last section in the cascade being coupled to said input switch through a feedback circuit,
the delay line of said sections having different delays.

* * * * *